United States Patent [19]
Yanagase et al.

[11] Patent Number: 5,528,057
[45] Date of Patent: Jun. 18, 1996

[54] SEMICONDUCTOR LUMINOUS ELEMENT WITH LIGHT REFLECTION AND FOCUSING CONFIGURATION

[75] Inventors: Masashi Yanagase; Hideaki Watanabe; Koichi Imamaka, all of Tsukuba, Japan

[73] Assignee: Omron Corporation, Japan

[21] Appl. No.: 250,773

[22] Filed: May 27, 1994

[30] Foreign Application Priority Data

May 28, 1993 [JP] Japan .................................. 5-151499

[51] Int. Cl.$^6$ .................................................. H01L 33/00
[52] U.S. Cl. ................... 257/96; 257/98; 257/97; 372/99; 372/50
[58] Field of Search ................... 257/98, 13, 96, 257/97; 372/44, 45, 50, 46, 99

[56] References Cited

U.S. PATENT DOCUMENTS

| | | | |
|---|---|---|---|
| 5,132,750 | 7/1992 | Kato et al. | 257/98 |
| 5,162,878 | 11/1992 | Sasagawa et al. | 257/98 |
| 5,351,256 | 9/1994 | Schneider et al. | 372/99 |
| 5,414,281 | 5/1995 | Watabe et al. | 257/98 |

FOREIGN PATENT DOCUMENTS

60-98689   6/1985   Japan ............................ 257/98

Primary Examiner—William Mintel
Assistant Examiner—Minhloan Tran
Attorney, Agent, or Firm—Klima & Hopkins

[57] ABSTRACT

A luminous element with a high luminous efficiency comprising means for condensing light towards an exit window of the element. Specifically, the luminous element condenses light generated at the luminous area of the luminous element by an optically reflective surface having oblique concentric surface portions.

14 Claims, 6 Drawing Sheets

SEMICONDUCTOR LUMINOUS ELEMENT WITH LIGHT REFLECTION AND FOCUSING CONFIGURATION

FIELD OF THE INVENTION

This invention concerns a semiconductor luminous element and an optical detector, an optical data processor, a photocoupler and a luminous device which employs this luminous element. More specifically, it concerns a semiconductor luminous element of a type which emits light from its surface or of a type which emits light from one of its edges, which has a high output and a luminous surface of microscopic dimensions. Such a luminous element is used in fields such as optical communication or optical data processing, where its attributes are crucially important. This invention also concerns the application of the semiconductor luminous element: for use in an optical detector, an optical data processor, a photocoupler, and a luminous projector.

BACKGROUND OF THE INVENTION

One objective in the design of semiconductor luminous elements is improved efficiency of light emission. An example of a semiconductor luminous element of the prior art which was designed for improved efficiency is disclosed in Japanese Patent Publication(Kokai Kohou 60-98689).

Figure 10:
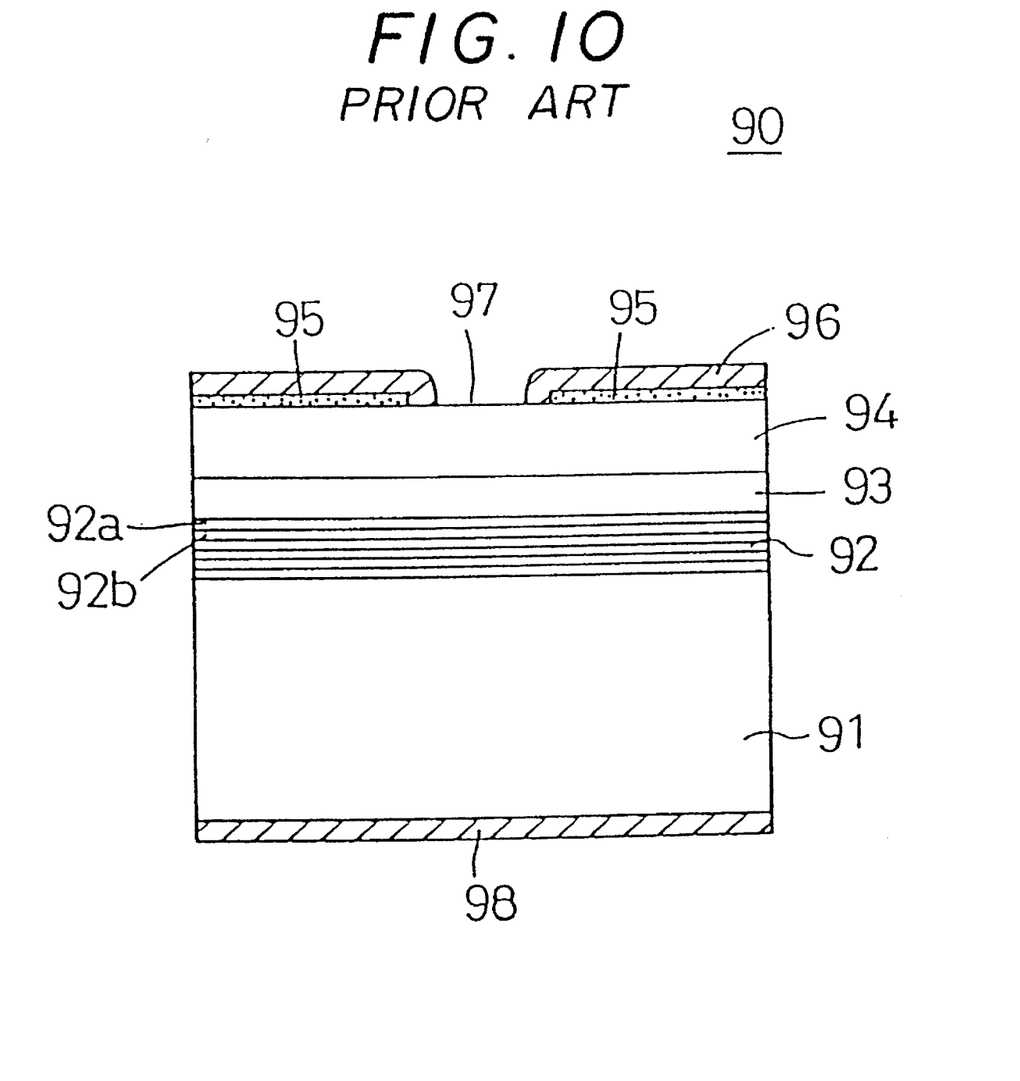
FIG. 10 shows a cross section of a semiconductor luminous element belonging to the prior art.

The configuration of this prior art semiconductor luminous element (or light emitting diode) is shown in FIG. 10. Semiconductor luminous element 90 consists of AlGaAs semiconductor substrate 91 and multilayer reflective film 92, GaAs active layer 93, and AlGaAs cladding layer 94, which are laminated atop substrate 91. Multilayer reflective film 92 consists of two types of semiconductor thin films, 92a and 92b, which are grown as crystals alternately until the laminate has at least twelve layers. On the upper surface of cladding layer 94 is insulation layer 95, consisting of $SiO_2$ or some similar substance. On top of the insulation layer is Al electrode 96. A window, 97, is provided in electrode 96 for the emission of light. On the periphery of window 97, electrode 96 comes in contact with cladding layer 94. An electrode 98 is formed on the lower surface of semiconductor substrate 91.

When the current is conducted from electrode 96 to active layer 93 in the region around the edges of window 97, light is emitted in the region of active layer 93 traversed by the current. The light projected upward by active layer 93 is channeled to the exterior via window 97. The light projected downward by active layer 93 is reflected by multilayer reflective film 92 and then channeled to the exterior via window 97.

The aforesaid semiconductor luminous element 90 has a multilayer reflective film 92 sandwiched between semiconductor substrate 91 and active layer 93. Thus the light emitted by active layer 93 which proceeds in the direction of semiconductor substrate 91 can be reflected by multilayer film 92 and channeled toward window 97 so as to increase the efficiency of emission.

However, a semiconductor luminous element 90 with the configuration described above channels to the exterior only the light reflected toward window 97 on the first reflection. Since the light-emitting region of luminous element 90 is microscopic, the efficiency of emission can only be improved slightly. If we wish further to improve the efficiency, this design does not seem promising.

SUMMARY OF THE INVENTION

This invention was designed in view of the problems in the prior art.

An object of the present invention is to provide a semiconductor luminous element with a high efficiency of emission even though its light-emitting region is microscopic. It would accomplish this by condensing toward the exit window virtually all the light which is emitted.

Another object of the invention is to provide an optical detector and other devices with high resolution by employing such a semiconductor luminous element.

The semiconductor luminous element of this invention is distinguished by the following features. On the upper surface of a substrate is formed a multilayer reflective film which is a laminate consisting of a number of layers of thin film with different refractive indices. An active layer is formed on top of this multilayer reflective film, sandwiched between upper and lower cladding layers. An optically reflective layer, which has elements at oblique angles with respect to the surface of the substrate, is provided on top of the aforesaid upper cladding layer to condense the light emitted by the aforesaid active layer and the light reflected by the aforesaid multilayer reflective film toward a window through which it can escape.

In the aforesaid semiconductor luminous element, portions of the upper surface of the aforesaid upper cladding layer can be set at oblique angles with respect to the surface of the substrate; and an optically reflective surface can be formed on the top of the upper cladding layer by making use of the difference between the refractive indices of the layer on top of the upper cladding layer and the upper cladding layer itself.

The aforesaid multilayer reflective film can consist of a number of films of various thicknesses.

If the luminous element is of the type which emits light from its surface, the aforesaid optically reflective surface can be divided into concentric circles, and the center of the said optically reflective surface can be roughly aligned with a window provided above that surface through which the light can escape.

If the luminous element is of a type which emits light from one of its edges, the aforesaid optically reflective surface can be divided into concentric semicircles, and the center of the said optically reflective surface can be aligned with the edge of the element which emits the light or somewhere in the vicinity thereof.

For the layer on top of the aforesaid optically reflective surface, a surface electrode can be used.

The aforesaid semiconductor luminous element can be used in an optical detector device, an optical data processor device, a photocoupler, or a luminous device.

The semiconductor luminous element of this invention has a multilayer reflective film below the active layer, and above the active layer, optically reflective surfaces at oblique angles with respect to the surface of the substrate. Thus, the light emitted by the active layer is repeatedly reflected between the reflective film below it and the reflective surface above it. Unlike the reflection by a surface which is parallel to the surface of the substrate, the light reflected by the reflective surfaces above the active layer proceeds along various courses according to the pitch of the normal line of each reflective lens surface. Thus light which is at first reflected away from the exit window can be conducted back to the vicinity of the window on a later reflection. To the extent that the light reflected by the reflective surface proceeds toward the window, is reflected by the multilayer reflective surface and emitted to the exterior through the exit window, and the efficiency of emission is improved.

The aforesaid optically reflective surface may be fashioned separately from the upper cladding layer, or it may be formed directly on the surface of that layer. If the latter design is chosen, the surface can easily be produced by means of a semiconductor production process.

BRIEF DESCRIPTION OF THE INVENTION

FIG. 1 (b) is a plan view of the pattern on the reflecting lens layer of this element.

FIG. 5 (b) is a plan view of the pattern on the reflecting lens layer of this element

DETAILED DESCRIPTION OF THE INVENTION

Figure 1A:
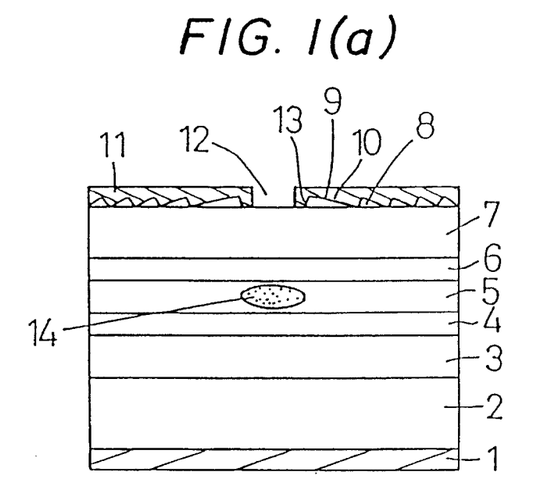
FIG. 1(a) shows a cross section of a semiconductor luminous element which is a preferred embodiment of this invention.

FIG. 1 (a) shows a cross section of semiconductor luminous element A, a surface-emitting element which is a first preferred embodiment of this invention. Luminous element A consists of semiconductor substrate 2, on which is fashioned multilayer reflective film 3, which is a laminate with a number of layers of thin film with different refractive indices; lower cladding layer 4; active layer 5, which emits light; upper cladding layer 6; and cap layer 7. All of these layers are stacked one atop the next starting with substrate 2. On top of cap layer 7 is reflecting lens layer 8, which is formed from an insulating material. Surface electrode 11 is provided on top of lens layer 8 to conduct the current. Surface electrode 1 is formed on the lower surface of semiconductor substrate 2. Window 12 is provided in surface electrode 11 to allow the light to escape. On its edges, surface electrode 11 comes in contact with the upper surface of cap layer 7.

Figure 1B:
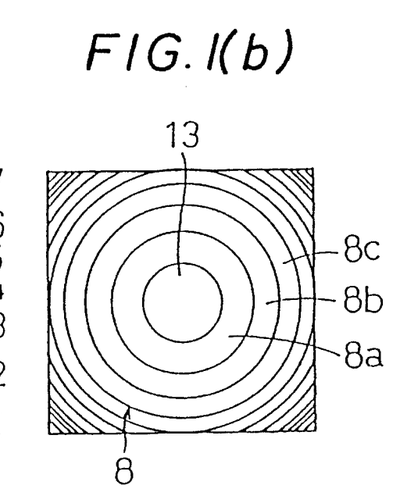

The aforesaid lens layer 8 is divided into concentric bands 8a, 8b, ..., as shown in FIG. 1 (b) (or only a portion of the bands shown), with the center left open, so that window 12 can be aligned with opening 13 in the center of reflecting lens layer 8. To the upper surface of each concentric band 8a, 8b, ... is attached a reflective film 9, preferably provided by depositing a metal with high reflectivity. Optically reflective surfaces 10 (reverse-surface mirrors) are formed on the upper surfaces of reflecting lens layer 8. The optically reflective surface 10 of each concentric band 8a, 8b, ... is at an oblique angle with respect to the surface of semiconductor substrate 2. Each reflective surface 10 on a concentric band 8 is set at a different pitch, so that each surface 10 reflects the light toward the center of reflecting lens layer 8 (i.e., toward window 12).

Although the details are not shown in the drawing, multilayer reflective film 3 generally consists of two materials with different refractive indices which are stacked alternately at a thickness $\beta$. Light whose wavelength is $4\beta$ within multilayer reflective film 3 will be reflected most intensely. However, because the wavelength component of the light emitted by luminous area 14 in active layer 5 is broad, it may happen that reflection occurs in multilayer reflective film 3 over a wide region of wavelengths. In this case, the efficiency of emission can effectively be improved by constructing multilayer reflective film 3 from a number of materials of thicknesses $\beta_1$, $\beta_2$, $\beta_3$, ..., so that each wavelength of $4\beta_1$, $4\beta_2$, $4\beta_3$, ... is reflected most intensely. In this way reflection can be made to occur over a wide region of wavelengths.

Semiconductor luminous element A can be manufactured as follows. First, multilayer reflective film 3, lower cladding layer 4, active layer 5, upper cladding layer 6 and cap layer 7 are grown as epitaxial layers on semiconductor substrate 2 in the order given. Reflecting lens layer 8, with its concentric annular lenses set at oblique angles with respect to the surface of semiconductor substrate 2, can be formed as follows. A polymeric solvent can be applied to the surface of cap layer 7, and a negative mold of a given shape can be pressed into the solvent. The lenses can then be hardened in an isothermal vat to form reflecting lens layer 8. Reflective film 9 can then be applied to the surface of layer 8 to form optically reflective surfaces 10. Lastly, front surface electrode 11 is formed on the surface surrounding window 12 and on its edges, and back surface electrode 1 is formed on the lower surface of semiconductor substrate 2. This completes the manufacture of semiconductor luminous element A.

Since in the luminous element A, the reflecting lens layer 8 is an insulator, current is not conducted from the region where layer 8 is formed. It can only flow to active layer 5 through the portion of surface electrode 11 which is on the edges of window 12. This is known as a channeled current configuration. As a result, the region of active layer 5 which faces window 12 serves as luminous area 14, the area from which light is emitted.

Figure 2:
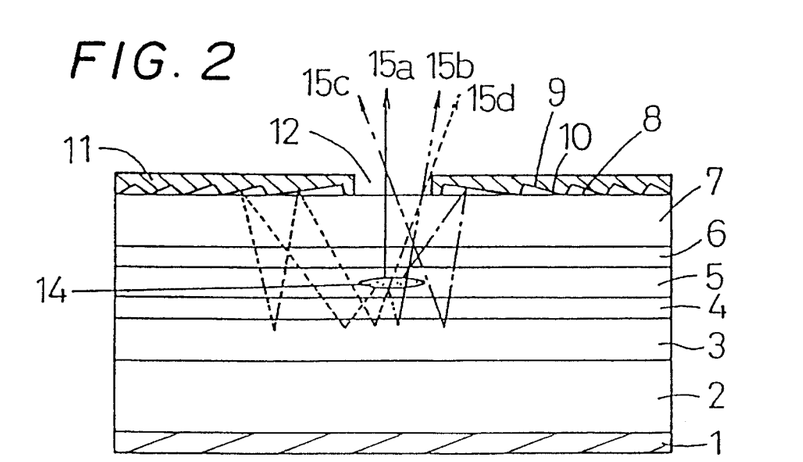
FIG. 2 shows the behavior of the light beams emitted by the same semiconductor luminous element.

The behavior of the light beams emitted by area 14 in semiconductor luminous element A is shown in FIG. 2. The light emitted by area 14 proceeds in all directions. Of all this light, only beam 15a, which travels directly to window 12 and hence to the exterior, and beam 15b, which exits through window 12 after being reflected once by underlying reflective film 3, is emitted to the exterior by a prior art semiconductor luminous element 90 (FIG. 10). With the luminous element A designed according to this invention, beam 15c, which travels to reflecting lens layer 8 on the periphery of window 12, is reflected by optically reflective surfaces 10 of layer 8 and multilayer reflective film 3 so that it, too, can exit through window 12. Beam 15d, which is reflected by film 3 away from window 12, can be reflected numerous times between reflective layer 10 of lens layer 8 and film 3 so that the probability that it too will travel toward window 12 and be emitted to the exterior is high. Thus luminous element A, designed according to this invention, has a higher efficiency of emission than prior art luminous element 90. Under ideal conditions, it would be possible for all the light emitted by luminous area 14 to be transmitted to the exterior via window 12.

In the embodiment pictured in FIGS. 1 and 2, a cap layer 7 is provided on top of upper cladding layer 6 to improve the contact between layer 6 and surface electrode 11. However, if cap layer 7 is highly optically absorptive, some light will be absorbed when the light is repeatedly reflected by lens layer 8. This point must be given careful consideration.

To the extent that conductive polymeric materials are not used in reflecting lens layer 8, that layer can fulfill both the function of supporting the optically reflective surface 10 and that of an insulation layer. In this way the channeled current configuration described above will inevitably result. If the area of the current path is restricted by such a configuration, the incidence of non-luminous recombination resulting from flaws in the crystal structure of the element will be reduced, and the rate of non-luminous recombination per unit of current will be reduced proportionally. This will also enhance the efficiency of emission. It is likewise possible to use conductive polymeric materials for reflecting lens layer 8. In this case, light can be emitted from the entire region surrounding window 12, and virtually all of the light which is emitted will be repeatedly reflected by surfaces 10 and reflective film 3 until it exits to the exterior via window 12. Thus even though this semiconductor luminous element A has a microscopic luminous region, the intensity of the emitted light can be expected to be high.

It would also be possible to eliminate reflective film 9 from above reflecting lens layer 8 and instead form surface electrode 11 directly on top of layer 8. The surface of the surface electrode 11 is sufficiently reflective to provide an optically reflective surface 10 located at the border between layer 8 and electrode 11. Such a design would require fewer processes to be used in the production of the element, so it would lower the production cost.

Figure 3:
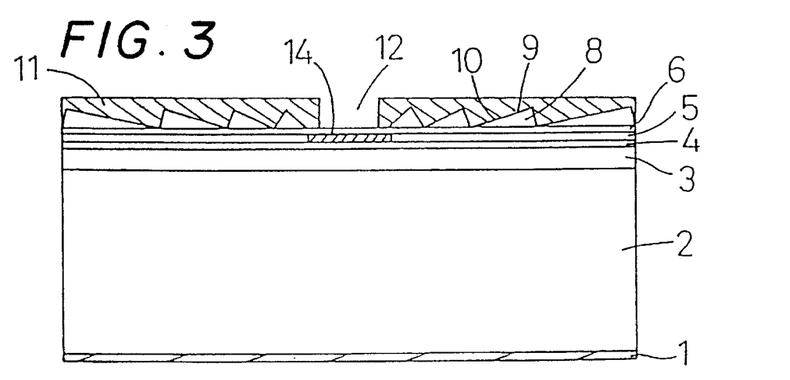
FIG. 3 shows a cross section of another semiconductor luminous element which is a preferred embodiment of this invention.

FIG. 3 shows a cross section of a second preferred embodiment of this invention to be referred to as semiconductor luminous element B. In this luminous element B, there is no cap layer 7 on top of upper cladding layer 6, and reflecting lens layer 8 is formed directly on top of layer 6. Even when cap layer 7 is eliminated, as in this embodiment, an improvement in efficiency of emission can be achieved which is similar to that produced by the embodiment in FIG. 1.

Figure 4:
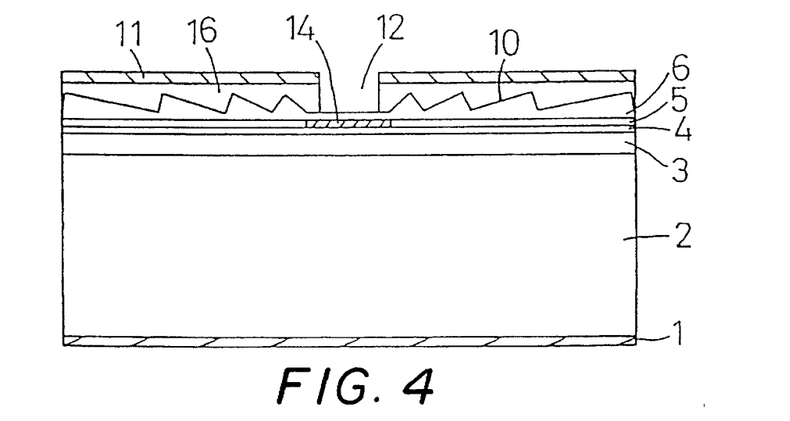
FIG. 4 shows a cross section of yet another semiconductor luminous element which is a preferred embodiment of this invention.

FIG. 4 shows a cross section of the structure of yet a third preferred embodiment of this invention to be referred to as semiconductor luminous element C. In this luminous element C, the function fulfilled by reflecting lens layer 8 in the embodiment shown in FIG. 1 is realized by upper cladding layer 6. The upper surface of cladding layer 6 is formed into a pattern of concentric rings in the same fashion as the upper surface of reflecting lens layer 8 in the embodiment shown in FIG. 1, however, layer 6 is not provided with an opening like opening 13 of layer in the embodiment of FIG. 1. These concentric rings on the surface of layer 6 are fashioned so that they are at oblique angles with respect to semiconductor substrate 2. On top of upper cladding layer 6 is formed another layer 16, from a material with a lower refractive index than layer 6. On the flat upper surface of layer 16 is surface electrode 11. The difference between the refractive indices of upper cladding layer 6 and layer 16 can be used to cause the surfaces on the border between the two to reflect (ideally, they should be totally reflective). In this way optically reflective surface 10 can be provided on the upper surface of cladding layer 6. Thus, upper cladding layer 6 will act in an identical fashion to the aforesaid reflecting lens layer 8. Causing the light to be reflected by surface 10, allows it to be condensed toward window 12, thus, improving the efficiency of emission.

In this embodiment, luminous element C can be produced using only a semiconductor production process. It is thus relatively simple to manufacture. If layer 16, the layer above upper cladding layer 6, is formed from an insulator, the element will have a channeled current configuration, and the efficiency of emission will be further enhanced. If layer 16 is formed from a conductor, we can expect that the intensity of the emitted light will be high despite the fact that the luminous area of semiconductor luminous element C is microscopic. Layer 16, the layer above upper cladding layer 6, may also serve as cap layer such as cap layer 7 in the embodiment shown in FIG. 1. Another alternative, not pictured in the drawings, is to omit layer 16 altogether and form surface electrode 11 directly on upper cladding layer 6. If a number of optically reflective surfaces 10 is created on the border between cladding layer 6 and electrode 11, a different embodiment can be produced.

In all of the embodiments discussed above, optically reflective surface 10 has the form of a pattern of concentric bands. Using such a pattern for reflective surfaces 10 and aligning its center with window 12 will yield the highest efficiency of emission and so is effective in improving luminous efficiency. This is not to say that reflecting lens layer 8 or upper cladding layer 6, when it performs the function of layer 8, must take the form of a concentric pattern of optically reflective surfaces 10. As long as the surface of lens layer 8 or cladding layer 6, whichever one constitutes reflecting surfaces 10, is made irregular in such a way that some of it is not parallel to semiconductor substrate 2, and it functions to condense the reflected light toward window 12, the design claimed as a part of this invention is not specifically limited to the pattern described above.

Figure 5A:
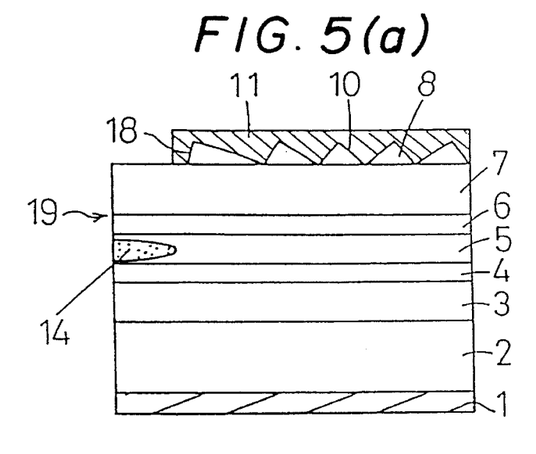
FIG. 5(a) shows the structure of a semiconductor luminous element which is another preferred embodiment of this invention.
Figure 5B:
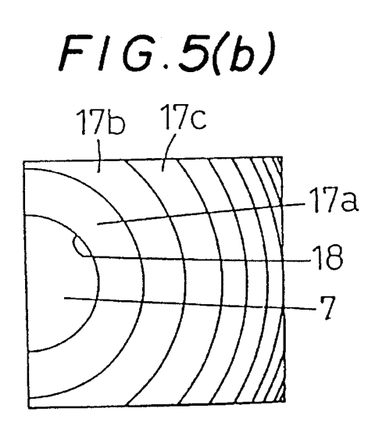

FIGS. 5A and 5B show a cross section of a fourth preferred embodiment of this invention referred to as semiconductor luminous element D, which emits light from its edge, and a plan view of its reflecting lens layer 8. In luminous element D, multilayer reflective film 3 is formed on top of semiconductor substrate 2. Subsequently, in successive order, are formed lower cladding layer 4, active layer 5, upper cladding layer 6, cap layer 7, reflecting lens layer 8, and surface electrode 11.

The aforesaid reflecting lens layer 8 is divided into concentric semicircular bands 17a, 17b, . . . (or a portion thereof), as shown in FIG. 5B. Optically reflective surface 10 are formed on its upper surface. The central portion of reflective surface 10, the portion corresponding to the center of the semicircular pattern on reflecting lens layer 8, is cut out. The cut-out portion 18, is aligned with luminous area 14. The numerous bands 17a, 17b, and so on of optically reflective surface 10 are pitched at oblique angles with respect to the surface of semiconductor substrate 2. The light emitted by luminous area 14 toward the side of the element opposite edge 19, i.e., opposite the luminous side, is reflected by multilayer reflective film 3 and optically reflective surfaces 10 so that it is aimed toward luminous edge 19, and from that edge it is emitted to the exterior. Thus, this configuration allows semiconductor luminous element D to achieve a high luminous efficiency.

In this section we shall discuss applications of the semiconductor luminous element described above.

Figure 6:
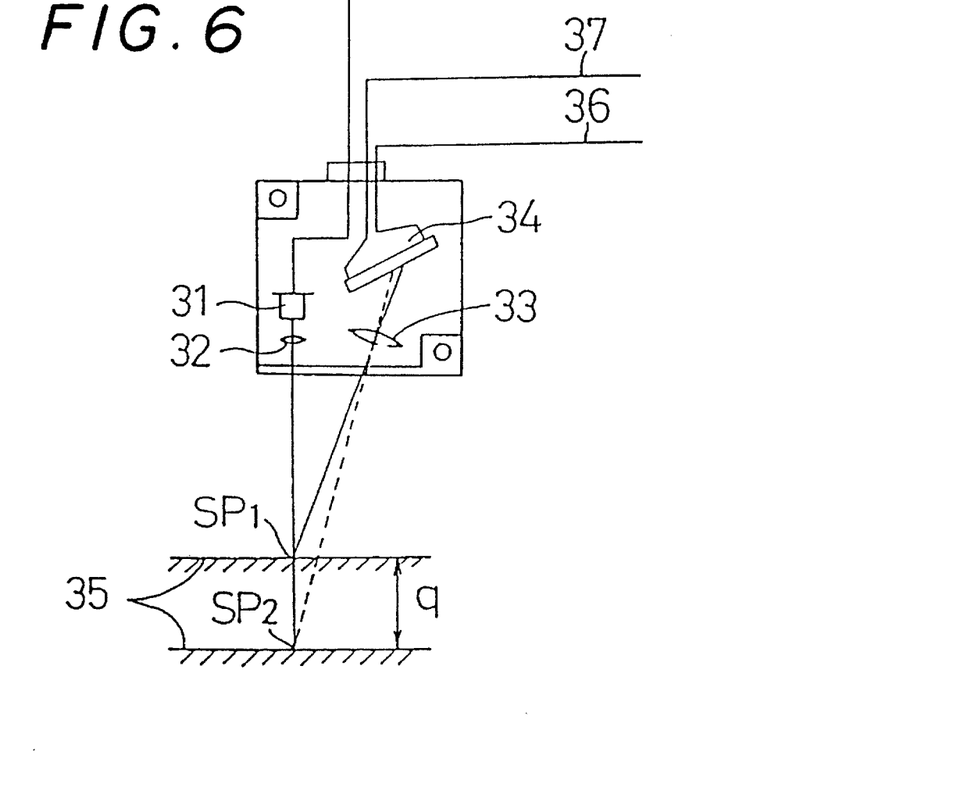
FIG. 6 is a diagram of a distance sensor incorporating this invention.

FIG. 6 shows an optical detector device which employs semiconductor luminous element 31, designed according to this invention. This device is distance sensor F, in which semiconductor luminous element 31 is used as a light source. Distance sensor F is used to measure the heights of the various surfaces of object 35. Sensor F consists of semiconductor luminous element 31, which serves as the light source, projection lens 32 and reception lens 33, and position detection element 34. The light emitted by the light source creates two beam spots SP1 and SP2, on object 35. The reflected images of SP1 and SP2 are focused on position detection device 34. The positions of these images are detected by comparing the signals obtained through signal lines 36 and 37. From the variance between the two positions, height difference q can be calculated by means of trigonometric measurement.

If an ordinary LED is used in distance sensor F, the diameter of the beam will be approximately 350 µm. This would make it difficult to use the sensor for applications which require detection at a remote distance or with a high degree of accuracy. The use of a laser diode will enable accurate detection over long distances, however, the use of a laser beam will give rise to problems in ensuring safety. This invention uses a semiconductor luminous element with a high output but a microscopic luminous diameter which enables detection over long distances. The diameter of the beam spots is kept small to afford high resolution. Since no laser beam is used, there need be no concerns over safety.

Figure 7:
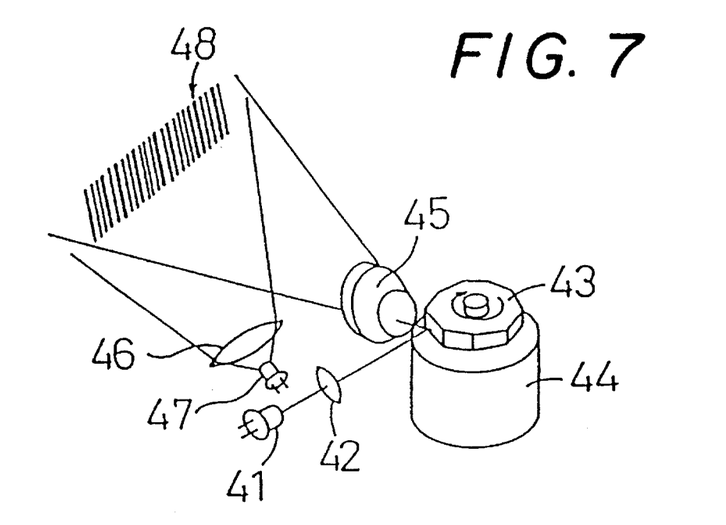
FIG. 7 is a perspective view of a bar code reader incorporating this invention.

FIG. 7 shows an optical data processing device employing a semiconductor luminous element designed according to this invention. This device is bar code reader G. The reader G consists of semiconductor luminous element 41; condensing lens 42, on the projecting side; rotating multifaceted mirror 43; scanner motor 44, which causes mirror 43 to rotate in a fixed direction at a uniform speed; isokinetic scanning lens 45; condensing lens 46, on the receptive side; and photodetector element 47. The light emitted by semiconductor luminous element 41 passes through condensing lens 42, is reflected by rotating multifaceted mirror 43, and is scanned in the horizontal plane. Its speed is made uniform by isokinetic scanning lens 45, and it is condensed and scanned on bar code 48. The light reflected by bar code 48 is condensed on photodetector element 47 by lens 46 and thereby detected, and signals representing the bar code are obtained.

Let us consider what would happen if a prior art LED of the type which emits light from its entire surface (with a beam diameter of 400 µm) were used in a bar code reader G of this sort, with the beam condensed on a bar code 250 mm away by a condensing lens with a focal distance of 15 mm. The poor focus would produce a beam diameter of 6.7 mm on the bar code, with the result that the code would be completely illegible. (Generally, the smallest width of a bar code will be 0.2 mm.) In contrast, bar code reader G, which uses a semiconductor luminous element 41 designed according to this invention, can produce a beam with a diameter of only 10 µm. Condensed under identical conditions, the beam will have a diameter (a little under 0.2 mm) on the surface of bar code 48 which is smaller than the narrowest bar in the code, and the code will be legible to bar code reader 48.

Figure 8:
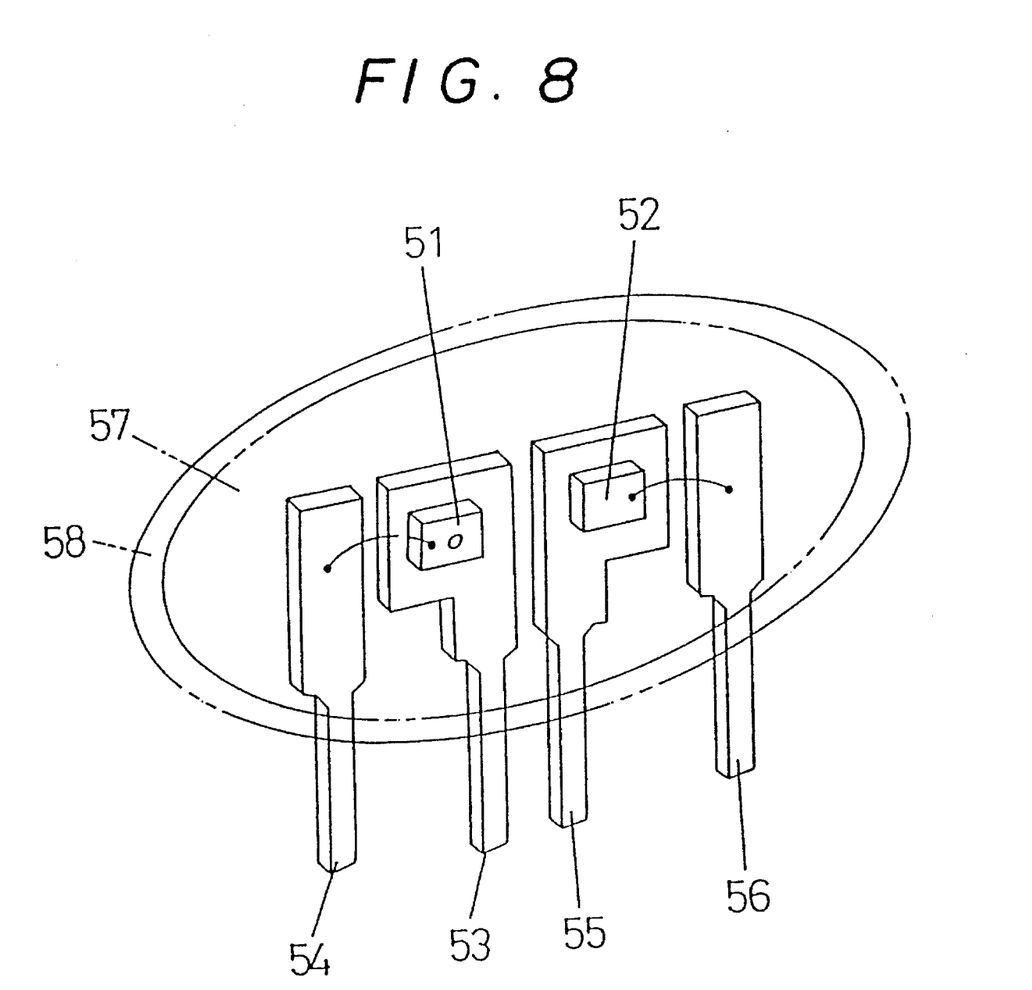
FIG. 8 is a perspective view of a photocoupler incorporating this invention.

FIG. 8 shows a photocoupler employing a semiconductor luminous element designed according to this invention. Photocoupler H, in which semiconductor luminous element 51 is used as a light source, has its components arranged on a flat surface. Photocoupler H consists of semiconductor luminous element 51 and semiconductor photodetector element 52, each of which is die bonded or wire bonded to a pair of lead frames 53 and 54 or 55 and 56, and sealed in clear epoxy resin 57. Reflective film 58 is formed on the surface of clear epoxy resin 57. Photocouplers are commonly configured with the luminous element and the photodetector element facing each other. Photocoupler H is distinguished by the fact that luminous element 51 and photodetector element 52 are arranged on the same flat surface.

This type of photocoupler H, with the components arranged on a flat surface, can easily be molded. Although it is simple to manufacture, the intensity of the emitted light is not high and a high efficiency of coupling cannot be achieved. If a semiconductor luminous element 51 designed according to this invention is substituted for a prior art luminous element in photocoupler H, a high luminous output can be realized, and high coupling efficiency will result. If clear epoxy resin 57 is molded into an ellipsoid, luminous element 51 and photodetector element 52 can be arranged so that each is at one of the focal points of the ellipsoid. Efficient coupling will result; and if a luminous element 51 according to this invention is used, the emitted beam will have a small diameter, so the coupling efficiency will be further enhanced.

Figure 9:
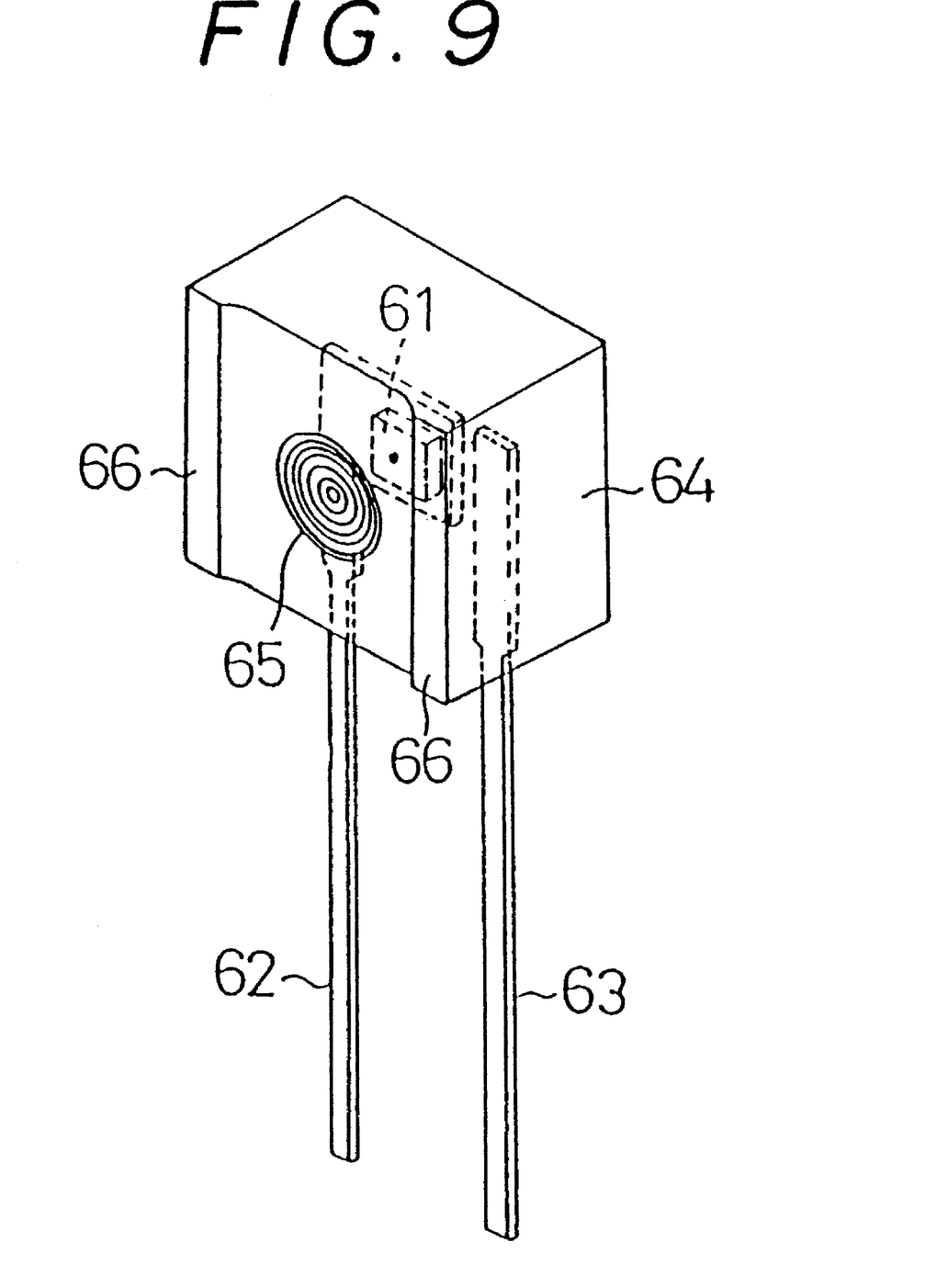
FIG. 9 is a perspective view of a flood light projector incorporating this invention.

FIG. 9 shows a luminous projector which employs a semiconductor luminous element designed according to this invention. More specifically, this device is a luminous projector J, in which semiconductor luminous element 61 is used as a light source. In luminous projector J, semiconductor luminous element 61 is die bonded or wire bonded to two lead frames, 62 and 63, and sealed, by low-pressure casting in a specified shape, in clear epoxy resin 64. On the front surface of clear epoxy resin housing 64 and of a single piece with it is formed flat Fresnel lens 65, consisting of a number of concentric lenses. On either side of the front surface of housing 64 are flanges 66, which are at the same height as Fresnel lens 65 or project slightly beyond it. The overall shape of projector J is that of a square block.

The semiconductor luminous element 61 used in luminous projector J has a high luminous efficiency and a microscopic luminous area. The use of flat Fresnel lens 65 constrains the directional characteristic of the light, so the output is high and a narrow beam can be achieved at a long distance. If, for example, we assume that Fresnel lens 65 has a focal distance of 4.5 mm, that the diameter of the lens is 3.5 mm, and that the diameter of the exit window in luminous element 61 is 20 µm, then the diameter of the beam at a distance of one meter will be approximately 4 mm. Considering that an ordinary LED, which has a luminous area with a diameter of 350 µm, will produce a beam with a diameter of 70 mm at that distance, the merits of using the element provided by this invention are significant.

The luminous element of this invention has, above its active layer, an optically reflective surface consisting of reflective bands pitched at oblique angles with respect to the surface of the substrate, and below its active layer, a multilayer reflective film. The light reflected by the reflective surface and the reflective film can thus be condensed toward an exit window. In this way light which is at first reflected away from the exit can be redirected toward the exit on a later reflection and eventually projected to the exterior, thus enhancing the luminous efficiency of the element.

If each layer of the multilayer reflective film has a different thickness, light will be reflected over a wide range of wavelengths. The reflectivity of the region below the active layer will be enhanced and the luminous efficiency will be improved.

In a semiconductor luminous element which emits light from its surface, the optically reflective surface can be fashioned into concentric bands whose center is aligned with the exit window for the light. In this way the luminous efficiency can be maximized. Similarly, in a semiconductor luminous element which emits light from one of its edges, the optically reflective surface can be divided into concentric semicircles, and their center can be aligned with the edge of the element which emits the light or somewhere in the vicinity thereof. In this way the luminous efficiency can be maximized.

If a surface electrode is used and its lower surface is fashioned into an optically reflective surface, the metal deposition process normally required to create the optically reflective surface could be eliminated, thus simplifying the production process used to manufacture the element.

The diameter of the beam emitted by a semiconductor luminous element designed according to this invention is small, and at the same time its luminous output is high. Thus, when such an element is used in an optical detection device, it obviates the need for a complicated optical system. Its accuracy of detection is excellent. An optical detector using this element will be safe for human beings. The same effects can be achieved in an optical data processing device. If the semiconductor luminous element of this invention is used in a photocoupler, the device which is realized will have a high conversion efficiency. If it is used in a luminous device, it will produce a narrow beam with a high output.

What is claimed is:

1. A semiconductor luminous element, comprising:
   a first electrode layer;
   a substrate;
   a multilayer reflective film, said multilayer reflective film is a laminate consisting of a number of layers of thin film with different refractive indices;
   a first cladding layer;
   an active layer;
   a second cladding layer, said active layer is located between said first cladding layer and said second cladding layer;
   an optically reflective surface positioned above said second cladding layer, said optically reflective surface having reflective surface portions positioned at oblique angles with respect to a surface of said multilayer reflective film to condense light emitted by said active layer and light reflected by said multilayer reflective film; and
   a second electrode layer having a window therethrough, whereby said optically reflective surface condenses light emitted by said active layer and light reflected by said multilayer reflective film through said window of said second electrode.

2. The element according to claim 1, wherein an upper surface of said second cladding layer is provided with surface portions positioned at oblique angles with respect to a surface of said multilayer reflective film, said second cladding layer is provided with an upper layer having a different indice of refraction relative to said second cladding layer defining said optically reflective surface at an interface therebetween.

3. The element according to claim 1, wherein said multilayer reflective film consists of a number of films of various thicknesses.

4. The element according to claim 1, wherein light is emitted from a surface of the element, and said optically reflective surface is defined by plural concentric band surface portions centered at a center of said window through said second electrode through which light escapes.

5. The element according to claim 1, wherein light is emitted from an edge of the element, and said optically reflective surface is defined by plural concentric bands centered at an edge of the element which emits the light therefrom.

6. The element according to claim 1, wherein said second electrode layer is formed on said optically reflective surface.

7. The element according to claim 3, wherein said second electrode layer is formed on said optically reflective surface.

8. The element according to claim 4, wherein said second electrode layer is formed on said optically reflective surface.

9. The element according to claim 5, wherein said second electrode layer is formed on said optically reflective surface.

10. The element according to claim 1, including an optically reflective layer provided with surface portions positioned at oblique angles with respect to a surface of said multilayer reflective film, said optically reflective layer supporting said optically reflective surface.

11. An optical detector, comprising:
   a semiconductor luminous element, comprising:
      a first electrode layer;
      a substrate;
      a multilayer reflective film, said multilayer reflective film is a laminate consisting of a number of layers of thin film with different refractive indices;
      a first cladding layer;
      an active layer;
      a second cladding layer, said active layer is located between said first cladding layer and said second cladding layer;
      an optically reflective surface positioned above said second cladding layer, said optically reflective surface having reflective surface portions positioned at oblique angles with respect to a surface of said multilayer reflective film to condense light emitted by said active layer and light reflected by said multilayer reflective film; and
      a second electrode layer having a window therethrough, whereby said optically reflective surface condenses light emitted by said active layer and light reflected by said multilayer reflective film through said window of said second electrode.

12. An optical data processor device, comprising:
   a semiconductor luminous element, comprising:
      a first electrode layer;
      a substrate;
      a multilayer reflective film, said multilayer reflective film is a laminate consisting of a number of layers of thin film with different refractive indices;
      a first cladding layer;
      an active layer;
      a second cladding layer, said active layer is located between said first cladding layer and said second cladding layer;
      an optically reflective surface positioned above said second cladding layer, said optically reflective surface having reflective surface portions positioned at oblique angles with respect to a surface of said multilayer reflective film to condense light emitted by said active layer and light reflected by said multilayer reflective film; and
      a second electrode layer having a window therethrough, whereby said optically reflective surface condenses light emitted by said active layer and light reflected by said mulilayer reflective film through said window of said second electrode, 13. A photocoupler, comprising:
a semiconductor luminous element, comprising:
   a first electrode layer;
   a substrate;
   a multilayer reflective film, said multilayer reflective film is a laminate consisting of a number of layers of thin film with different refractive indices;
   a first cladding layer;
   an active layer;
   a second cladding layer, said active layer is located between said first cladding layer and said second cladding layer;
   an optically reflective surface positioned above said second cladding layer, said optically reflective surface having reflective surface portions positioned at oblique angles with respect to a surface of said multilayer reflective film to condense light emitted by said active layer and light reflected by said multilayer reflective film; and
   a second electrode layer having a window therethrough, whereby said optically reflective surface condenses light emitted by said active layer and light reflected by said mulilayer reflective film through said window of said second electrode.

14. A luminous projector, comprising:
a semiconductor luminous element, comprising:
   a first electrode layer;
   a substrate;
   a multilayer reflective film, said multilayer reflective film is a laminate consisting of a number of layers of thin film with different refractive indices;
   a first cladding layer;
   an active layer;
   a second cladding layer, said active layer is located between said first cladding layer and said second cladding layer;
   an optically reflective surface positioned above said second cladding layer, said optically reflective surface having reflective surface portions positioned at oblique angles with respect to a surface of said multilayer reflective film to condense light emitted by said active layer and light reflected by said multilayer reflective film; and
   a second electrode layer having a window therethrough, whereby said optically reflective surface condenses light emitted by said active layer and light reflected by said mulilayer reflective film through said window of said second electrode.

* * * * *